(12) United States Patent
Wille

(10) Patent No.: US 9,786,413 B2
(45) Date of Patent: Oct. 10, 2017

(54) CODING SYSTEM AND I/O MODULE OF AN AUTOMATION DEVICE HAVING SUCH A CODING SYSTEM

(71) Applicant: PHOENIX CONTACT GMBH & CO.KG, Blomberg (DE)

(72) Inventor: Peter Wille, Paderborn (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 14/896,878

(22) PCT Filed: Jun. 11, 2014

(86) PCT No.: PCT/EP2014/062115
§ 371 (c)(1),
(2) Date: Dec. 8, 2015

(87) PCT Pub. No.: WO2014/198763
PCT Pub. Date: Dec. 18, 2014

(65) Prior Publication Data
US 2016/0118162 A1  Apr. 28, 2016

(30) Foreign Application Priority Data

Jun. 11, 2013  (DE) .......................... 10 2013 009 682

(51) Int. Cl.
*H01B 7/36* (2006.01)
*H05K 7/14* (2006.01)
*H01B 7/00* (2006.01)

(52) U.S. Cl.
CPC ........... *H01B 7/361* (2013.01); *H01B 7/0045* (2013.01); *H01B 7/365* (2013.01); *H05K 7/1469* (2013.01)

(58) Field of Classification Search
CPC ....... H01B 7/361; H01B 7/0045; H01B 7/365
See application file for complete search history.

(56) References Cited

U.S. PATENT DOCUMENTS 6,531,657 B1 *  3/2003  Jones, Jr.  ............... H01R 31/06
174/112
2004/0222008 A1 *  11/2004  Hyde  ....................... H02G 3/00
174/72 A (Continued)

FOREIGN PATENT DOCUMENTS

DE  40 16 445 A1  8/1991
DE  43 95 807 T1  10/1995

(Continued)

OTHER PUBLICATIONS

International Search Report issued in connection with corresponding International Application No. PCT/EP2014/062115 mailed Jan. 5, 2015 (13 pages total).

(Continued)

*Primary Examiner* — Hoa C Nguyen
*Assistant Examiner* — Stanley Tso
(74) *Attorney, Agent, or Firm* — Maldjian Law Group LLC

(57) ABSTRACT

The invention relates to a coding system comprising at least one assembly of a plurality of individual wires, wherein one end of each individual wire is connected to a common adapter which is to be connected to an I/O module of an automation device for coupling an external device to a control unit of an automation system, and wherein the assembly of individual wires is bundled into at least two cables emanating from the common adapter, and is color-coded.

15 Claims, 3 Drawing Sheets

(56) References Cited

U.S. PATENT DOCUMENTS

| | | | | |
|---|---|---|---|---|
| 2009/0096656 A1* | 4/2009 | Smith | ............... | G08C 17/02 |
| | | | | 341/176 |
| 2013/0146355 A1* | 6/2013 | Strasser | ............ | G02B 6/4471 |
| | | | | 174/72 A |
| 2014/0174819 A1* | 6/2014 | Mafi | ............... | H02G 3/0462 |
| | | | | 174/72 A |

FOREIGN PATENT DOCUMENTS

| | | | |
|---|---|---|---|
| DE | 20 2008 004 800 U1 | 9/2009 | |
| EP | 2 568 788 A2 | 3/2013 | |
| EP | 2 600 705 A2 | 6/2013 | |
| WO | 94/11886 A1 | 5/1994 | |

OTHER PUBLICATIONS

Anonymous, "SGI TPL (IRIX 6.5: Appendix B. Setting Up the HD I/O Board for Your Video Hardware)" Published: Dec. 14, 2000 Retrieved from: http://techpubs.sgi.com/library/tpl/cgi-bin/getdoc.cgi?coll=0650&db=bks&srch=&fname=/SGI EndUser/HDIO OG/sgihtml/apb.html [retrieved on Dec. 15, 2014] (6 pages total).
Underwriters Laboratories Inc. "Programmable Controller IC600WDXXX GEK-83517F I/O Cables" Apr. 2004 Retrieved from http://support.ge-ip.com/support/resou rces/sites/GE FANUC SUPPORT/content/live/DOCUMENT/0/00762/en US/GEK83517F.pdf [retrieved on Dec. 15, 2014](3 pages total).
General Standards Corporation, "Accessories" May 29, 2013 Retrieved from: http://www.generalstandards.com/accessories.php [retrieved on Dec. 15, 2014] (6 pages total).
Lumbergautomation: A Belden Brand, "LioN-Link the Modular, Fieldbus Independent I/O System: Optimization of Field Wiring Through the Utilization of a Modular IP 67 Fieldbus Solution", 2010 (64 pages total).
International Preliminary Report on Patenability for International application No. PCT/EP2014/062115 dated Dec. 23, 2015, 8 pgs.
Lumberg Automation: "Optimization of Field Wiring Through the Utilization of a Modular IP 67 Fieldbus Solution" Belden, Inc. (Apr. 2010) (64 pages total).

* cited by examiner

CODING SYSTEM AND I/O MODULE OF AN AUTOMATION DEVICE HAVING SUCH A CODING SYSTEM

FIELD

The present invention relates to a coding system consisting of at least one assembly of at least two individual wires, wherein one end of each individual wire is connected to a common adapter, which is to be connected to an I/O module of an automation device for coupling an external device to a control unit of an automation system, and also relates to an I/O module of an automation device comprising such a coding system.

BACKGROUND

Coding systems for mutual association of different components, including visual or color coding systems, are widely used in a plurality of industrial applications.

Also, there are several types of coding systems to identify numberings or intended functions of conductor wires of a cable by colors. For example, coding systems are known which are intended to facilitate correct wiring.

Accordingly, in three-wire cables, for example, in which one of the wires is marked in red, one of the wires in black, and one of the wires is marked in green/yellow, for example, the red wire should always be connected with '+', the black wire with '−', and the green/yellow wire should always be connected to ground.

Furthermore, another color coding for identifying wires of telecommunication cables is given by DIN 47100, for example, which although withdrawn is still often used.

Also, a 25-pair-color labeling is known, for identifying individual conductor or wirers in electrical telecommunication cables. This labeling is also referred to as "twisted-pair cabling" and is usually applied to RJ21 cables. For identification purposes, the colors are applied to the wire insulation. For each twisted pair of wires, a first color is selected from a first group of five colors and a second color is selected from a second group of five colors, so that in total 25 combinations of two colors are formed.

Moreover, it is known to mark cables that combine a plurality of wires with different colors, for example blue and green network cables. Again, this is intended to allow the user to quickly identify which components are to be connected or are connected with which cables.

Furthermore, it is known from DE 40 16 445 A1, for example, to identify both the wires bundled in cables and the cables themselves with different colors, to thereby distinguish the cables from each other and moreover easily identify the wires within a cable.

Accordingly, besides simplifying the allocation of individual wires to be connected in a circuit, it is additionally possible in this manner to more easily allocate a first color-coded cable to a first circuit and a second color-coded cable to a second circuit.

Furthermore, from DE 43 95 807 T1 it is known to bundle a plurality of such cables in a wiring harness and to provide the latter with a label, and/or to provide individually cut lengths of the wiring harness with appropriate connectors for each cable and for the wires or conductors included therein.

It is furthermore known, as part of wiring automation systems, also referred to as system wiring below, to bundle the conductor wires for transmitting input/output signals (I/O signals) between an input/output module (I/O module) of an automation device for coupling an external device to a control unit and this external device by means of a common connector pluggable into the I/O module, and then to route the conductor wires from the connector plugged into the I/O module to the external device either in a single cable or as a bundle of individual wire. In this case, the I/O module itself may perform signal control and/or signal processing functions as well. For this purpose, these signal control and/or signal processing functions may be included in a pluggable input/output card (I/O card), for example, which is accommodated by the I/O module and on which these functions are stored in hardware (e.g. hard-wired) and/or in software (e.g. by means of a programmable logic controller "PLC"). Depending on the specific implementation, the I/O signals may comprise analog signals and/or digital signals in this case.

External devices, also referred to as peripheral modules below, may in particular include modules with pluggable relays and other modules, but also field devices such as actuators and sensors. An example for a module with pluggable relay that may be mentioned is the module marketed by the applicant under the designation "V8 adapter".

The connection to the external devices is then made either through terminals, e.g. with spring-cage connection or screw connection or with insulation displacement terminals, or via connector systems such as the so-called D-SUB connector system for data connections, and other proprietary connector systems.

Now, one problem is, for example, that for wiring solutions often the assignment of the wires is considerably more difficult, the more conductor wires are required for signal transmission between an input/output module (I/O module) of an automation device and an external device, which may ultimately result in wiring errors and thus may cause malfunction of the automation system.

For example, if 32 or even more conductor wires wires are to be connected between an input/output module (I/O module) of an automation device and an external device, alone in case of 32 conductor wires which have one conductor wire end connected to the I/O module, there are already 528 connection possibilities for identifying the conductor wires ends at the end of the external device in a specific order and connecting them according to a predetermined wire assignment. This is because first one conductor wire has to be identified from 32 conductor wires, then another conductor wire from the remaining 31 conductor wires, and so on.

Therefore, already nowadays 8 to 10 individual wires are preferably combined and provided with a cable jacket. In case of a total of 40 individual wires with one end of each conductor wire connected to the I/O module, these wires can be bundled into e.g. 4 cables emanating from the I/O module, each cable with at least one connector for being connected to an external device, and in this case each connector for connection with the external device will have 10 terminals, for example. In the case of digital signals, for example, each connector to be connected to the external device may then represent 1 byte, and in the case of 10 bundled individual wires additional signals can even be transmitted, e.g. two additional 1-bit signals, or the power supply of the byte with a plus and a minus signal conductor.

Instead of the connectors for connection to the external device, it is also possible for the individual wires to just appear from the end of the cable in order to be connected with the external device, and in this case the individual wires have to be connected to the external device bit by bit, for example.

Therefore, in order to reduce wiring errors, the individual wires and/or the cables with a plurality of individual wires bundled therein are marked with an appropriate inscription.

This already makes the connecting operation considerably easier and less susceptible to errors, however, faulty connections may still often result.

Accordingly, a code may as well be applied on the two complementary components, i.e. the components that are to be connected to each other, e.g. on the male connector and mating female connector, to provide for an assignment coding.

For example, DE 20 2008 004 800 U1 describes a system consisting of at least one switching device and at least one electrically switchable consumer and at least two connecting cables for directly or indirectly connecting the switching device and the consumer, wherein the system comprises at least one wiring unit for interconnecting the connection cables, and wherein plug-in connector elements of the connecting cables and at least two plug-in connection elements of at least one wiring unit to which the cables are connectable, are visually coded.

SUMMARY

The present invention comprises a coding system that is novel over the prior art and which ensures improved allocation of conductor wires for transmission of I/O signals between an I/O module of an automation device and an external device to be coupled thereto, and by means of which an I/O module of an automation device and an external device can be interconnected quickly and without wiring errors.

According to the present invention this is achieved by the features of the independent claims. Embodiments of the present invention are specified in the dependent claims.

Accordingly, the present invention proposes a coding system, which comprises an assembly of a plurality of individual wires, wherein one end of each individual wire of this assembly is connected to a common adapter, which is to be connected to an I/O module of an automation device for coupling an external device to a control unit of an automation system, wherein the order of the individual wires is defined by the common adapter connectable to the I/O module, and wherein the assembly of individual wires is bundled in at least two cables emanating from the common adapter, and wherein the assembly bundled in the at least two cables is color-coded.

According to a first embodiment, the cables are coded by colors.

According to an alternative or additional embodiment, the assembly of individual wires is bundled in at least two cables emanating from the common adapter, and at the ends of these cables distal from the common adapter a respective connection device is arranged, to which the respective other end of each individual wire is connected, and these connection devices are coded by colors.

Furthermore, the present invention proposes an I/O an I/O module of an automation device, which comprises such a coding system for coupling an external device to a control unit of an automation system and/or which comprises at least one adapter, wherein an assembly of a plurality of individual wires is connected to the adapter with a respective end of each individual wire, wherein the order of the individual wires is defined by the common adapter, and wherein the assembly of individual wires is bundled in at least two cables emanating from the common adapter, and wherein the assembly bundled in the at least two cables is coded by colors.

A significant advantage of the present invention is that based on the bundling of wires in cables and thus predetermined clustering and based on the color coding, the assignment of signal-carrying wires is already predetermined at least partially, when an external device is to be coupled to a control unit of an automation system, and is therefore further simplified significantly, so that the risk of wiring errors and resultant faulty behavior of the automation system is further reduced and installation is considerably accelerated compared to systems of the prior art described above. The color code preferably comprises a bit-based and/or byte-based code in this case.

According to one embodiment, the color code comprises a color gradation. The color code is in particular based on different hues, color saturations, and/or lightnesses, for example from light gray to dark gray.

According to an embodiment supplementing this embodiment, a written code is provided in addition to the color coding, in particular a bit-based and/or byte-based code.

According to a preferred embodiment of the present invention, the assembly of individual wires comprises at least 8 individual wires. This provides the advantage, for example, to represent one byte by means of the signals routed through the at least 8 individual wires.

According to another preferred embodiment of the present invention, the assembly of individual wires comprises at least 16 individual wires, wherein at least 8 individual wires are bundled into a respective cable emanating from the common adapter. This provides the advantage to represent one byte by signals routed through a common cable, for example.

BRIEF DESCRIPTION OF THE DRAWINGS

The present invention will now be described by way of exemplary embodiments and with reference to the drawings, wherein.

DETAILED DESCRIPTION

Figure 1:
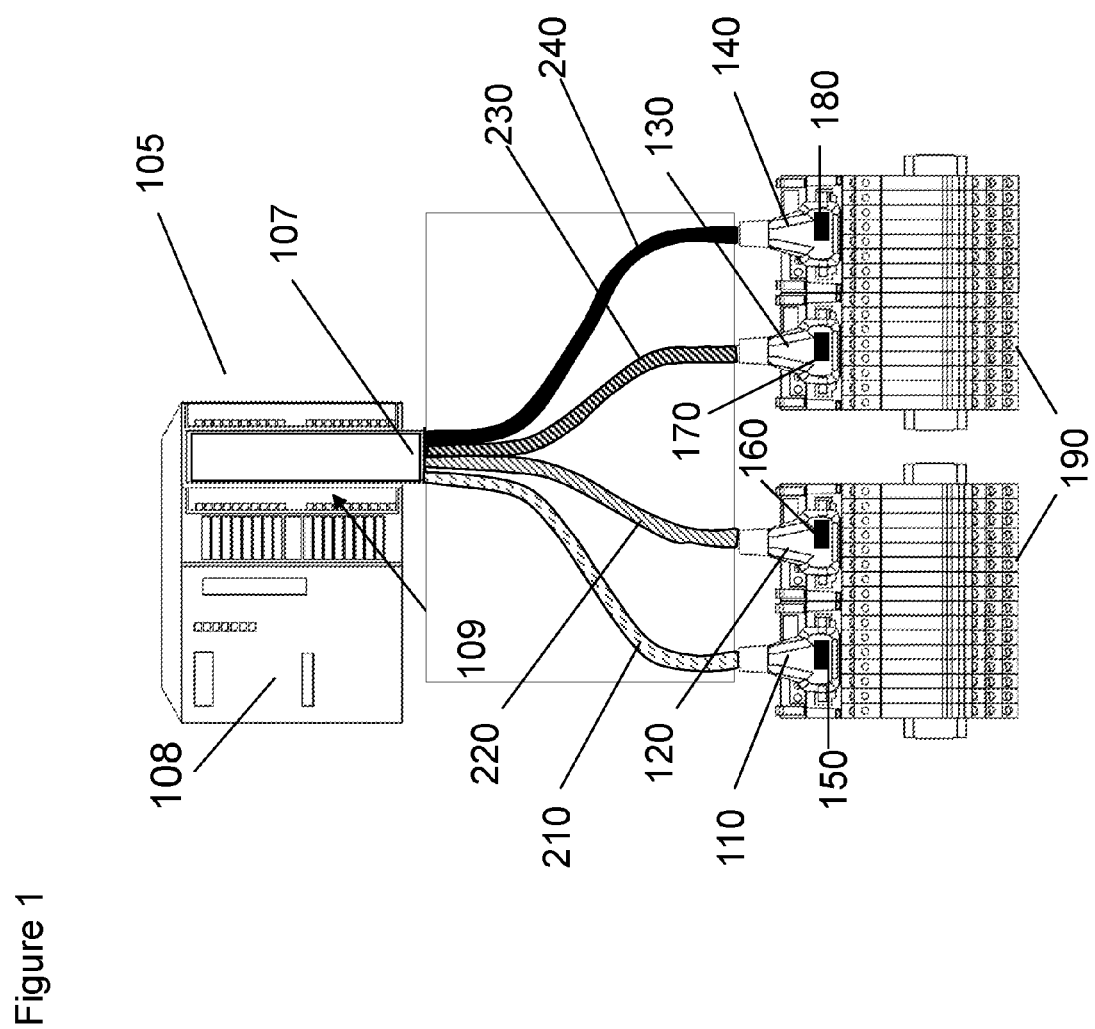
FIG. 1 schematically illustrates one embodiment of a coding system according to the present invention, with 4 cables coded by graded colors, by way of example, with a common pre-wired front adapter on one end and with plug-in connectors on the other end, for transmission of I/O signals between an I/O module of an automation device for coupling an external device and this external device.

For the following description it should be noted that elements designated with the same reference numerals in the figures basically correspond to each other.

As part of a wiring operation of automation systems it is known to bundle the conductor wires, also referred to as individual wires, for transmission of I/O signals between an I/O module of an automation device for coupling an external device to a control unit and this external device, for example by means of a connector that can be plugged into the I/O module, and to route the conductor wires from the connector plugged into the I/O module to the external device either within a single cable or as a bundle of individual wires. It is also possible that the I/O module itself performs signal control and/or signal processing functions. For this purpose, these signal control and/or signal processing functions may for instance be included in a plug-in I/O card accommodated by the I/O module, on which these functions are stored in hardware, e.g. hard-wired, and/or in software, e.g. by a programmable logic controller (PLC). Depending on the specific implementation, the I/O signals may comprise analog signals and/or digital signals.

Here, external devices may in particular include modules with pluggable relays and other modules, and also field devices such as actuators and sensors.

The connection to the external devices is then made either through terminals, e.g. with spring-cage connection or screw connection or with insulation displacement terminals, or via connector systems such as the so-called D-SUB connector system for data connections and other proprietary connector systems.

Based on the automation device described above, FIG. 1 schematically illustrates one embodiment of a coding system according to the present invention, which comprises at least one assembly of at least two individual wires, and one end of each individual wire of this assembly is connected to a common adapter 107. Adapter 107, in turn, can be connected to an I/O module 109 of automation device 105, for connecting an external device 190 to a control unit.

Actuators, such as motors, signal lamps, etc., and/or sensors, such as fill level sensors, limit switches, etc., may then be connected to the external devices 190. Alternatively, however, an external device 190 may itself be an actuator or sensor, for example.

Thus, the order of the individual wires is defined by the common adapter 107, and the assembly of individual wires is bundled into at least two cables 210, 220, 230, 240, emanating from common adapter 107, which cables are coded by colors.

Automation device 105 may furthermore comprise a power supply and a central processing unit (CPU) 108 as additional essential components.

According to FIG. 1, the adapter 107 is already plugged into I/O module 109 and connects external devices 190 with this I/O module 109, and, in this example, automation device 105 is preferably configured as a control unit (CPU 108 plus I/O cards), which therefore itself provides control for an automation system and may be operated independently or may be part of a larger system linked into a higher level automation system, e.g. a master control system.

The I/O module 109 accommodated by the automation device 105 of FIG. 1, which may alternatively be connected to automation device 105 as a separate module, for example via a further cable link or bus connection, may be configured with analog and/or digital inputs and/or outputs, depending on the specific embodiment.

For the sake of simplicity, the following description is based on a configuration having digital inputs/outputs.

As indicated in FIG. 1, the color coding of the cable according to this embodiment is a coding based on a color gradation. Such a code may be based on different hues, color saturations and/or lightnesses, for example.

Since the order of the individual wires is defined defined by the common adapter 107, it is possible to assign a specific bit to specific individual wires within the assembly, for example. If the assembly of individual wires comprises at least 8 individual wires, for example, it is not only favorable to assign one bit to each respective individual wire within the assembly, moreover it is consequently possible to represent one byte by the signals routed via the at least 8 individual wires.

If, for example, each cable 210, 220, 230, 240 bundles 8 to 10 individual wires, such a byte may be appropriately represented by the signals routed via a common cable. For example, in case of 10 individual wires per cable it is even possible to transmit additional signals, including power supply and/or return signals.

With a coding based on a color gradation, cable 210, e.g. for byte 0, may be marked with a hue of a first lightness, and cable 220, e.g. for byte 1, with an identical or different hue of a second lightness, in particular lower lightness. For cable 230 which represents the next byte 2, for example, the lightness is reduced further, for example. In this manner, cables 210 to 240 may be marked with hues gradually darkening in each case, for example. A user then only needs to start with the lightest cable and then connect the next darker cable. Finally, the user will connect the darkest cable, byte 3 in the present example, which is cable 240 according to FIG. 1, to the external device. Consequently, the color coding comprises a byte-based code in this case. As a result of this color coding, the assignment of signal carrying wires is consequently already predetermined, at least partially. In this manner, faulty connections can be effectively prevented. Of course, it is likewise possible to provide the increase or decrease of lightness or other color gradation in reverse order.

As can be further seen from FIG. 1, a respective connection device 110, 120, 130, 140 may be arranged at the cables 210, 220, 230, 240 at the ends remote from the common adapter 107, to which the respective other end of an individual wire is connected. Accordingly, these connection devices which take the form of a plug-in connector in FIG. 1, are adapted for connection to an external device 190 and may likewise have a color code, alternatively or additionally to the color code of cables 210, 220, 230, and 240 as described above, which however is not further illustrated in FIG. 1, for the sake of clarity.

Such a color code, in particular color gradation, further reduces the risk of wiring errors and resultant faulty behavior of the automation system.

Optionally, a written code may be provided in addition to the color code, for example a bit-based and/or byte-based code.

According to the embodiment of FIG. 1, such a written code is appropriately applied on connection devices 110, 120, 130, 140 which take the form of plug-in connectors. Connecting device 110 has a written code 150, e.g. "Byte 0", connection device 120 has a written code 160, e.g. "Byte 1", connection device 130 has a written code 170, e.g. "Byte 2", and connection device 140 has a written code 180, e.g. "Byte 3".

Figure 2:
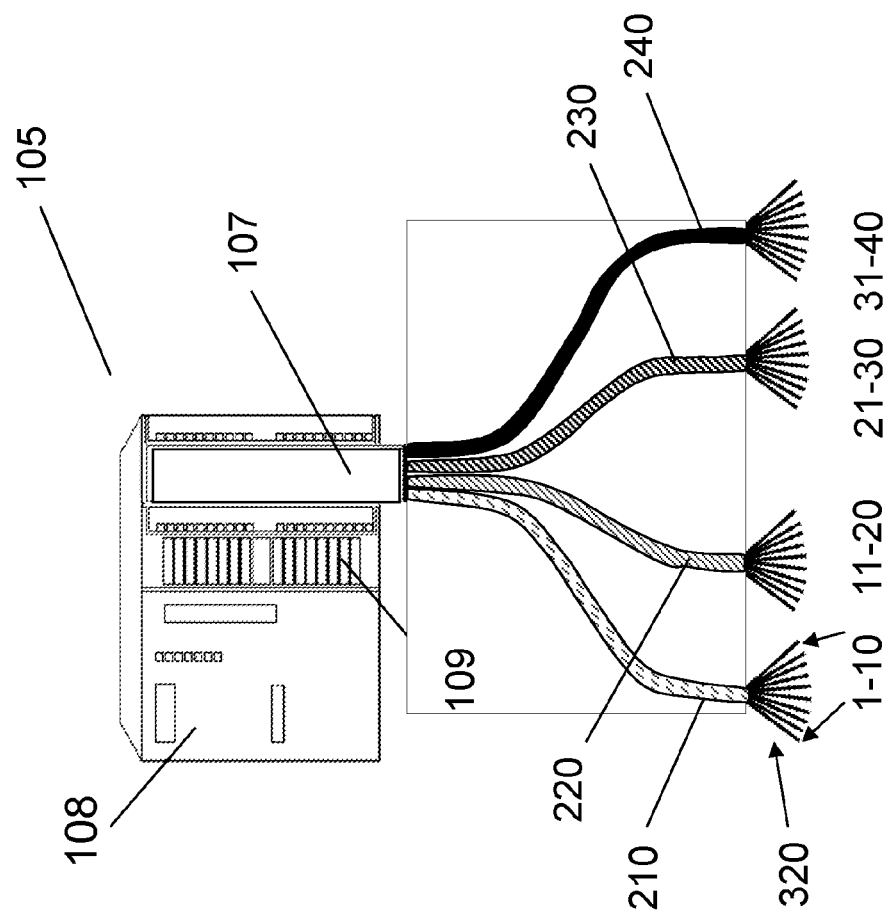
FIG. 2 schematically illustrates another embodiment of a coding system according to the present invention, with 4 cables coded by graded colors, by way of example, with a common pre-wired front adapter on one end, and with individual wires on the other end, for transmission of I/O signals between an I/O module of an automation device for coupling an external device and this external device.

FIG. 2 shows an embodiment modified compared to the embodiment of FIG. 1.

As a modification compared to FIG. 1, the embodiment of FIG. 2 does not comprise connection devices in the form of plug-in connectors at the distal ends of cables 210, 220, 230, 240 remote from common adapter 107. Rather, the ends of the individual wires 320 appear from these cable ends and now have to be individually connected to an external device, for example by means of screw connection terminals such as screw connection terminals 350 shown in FIG. 3.

Even in this case, the bundling of a plurality of individual wires into different cables, for example the bundling of 40 individual wires 320 into 4 cables 210, 220, 230, 240 in combination with the color coding of the cables, in particular with a color gradation as described above, provides for a significantly improved assignment.

According to the prior art, with 32 non-bundled conductor wires there are basically 528 connection possibilities at the distal ends remote from common adapter 107, and with 40 non-bundled conductor wires there are basically 820 connection possibilities for finding the desired or correct individual wires. By contrast, with 40 individual wires connected to a common adapter 107 and bundled into 4 cables emanating from this adapter and with each cable containing 10 individual wires, the maximum number of connection options is only 220.

The maximum number of connection options per cable (10 wires) is calculated as follows:
identifying one wire of 10 potential wires,
identifying one wire of 9 potential wires,
identifying one wire of 8 potential wires, and so on.

The maximum number of options per cable (10 wires) results from Gaussian sum formula:

$$\sum_{k=1}^{n} k = \frac{n(n+1)}{2},$$

wherein n is the number of individual wires in a cable, and k is the number of connection options for each individual wire in the cable. Consequently, in case of 10 individual wires, the resulting number of connection options per cable is $$\sum_{k=1}^{n} k = \frac{n(n+1)}{2} = \frac{10(10+1)}{2} = 55.$$

Since in the present example 4 cables each with 10 bundled individual wires were chosen, the sum for 4 cables is therefore equal to 4*55=220 possibilities. This is a significant reduction for the risk of wiring errors and a big time saving as compared to the wiring of individual wires, wire by wire, with a maximum of 820 possibilities.

Therefore, based on the above description the scope of the present invention also includes an I/O module 109 of an automation device 105, which comprises at least one adapter 107 for coupling an external device to a control unit of an automation system, wherein an assembly of a plurality of individual wires is connected to the adapter with a respective end of each individual wire, so that the order of the individual wires is defined by the common adapter, and wherein the assembly of individual wires is bundled into at least two cables 210, 220, 230, 240 emanating from the common adapter 107, as described above, and wherein the assembly bundled in the at least two cables is coded by colors.

Figure 3:
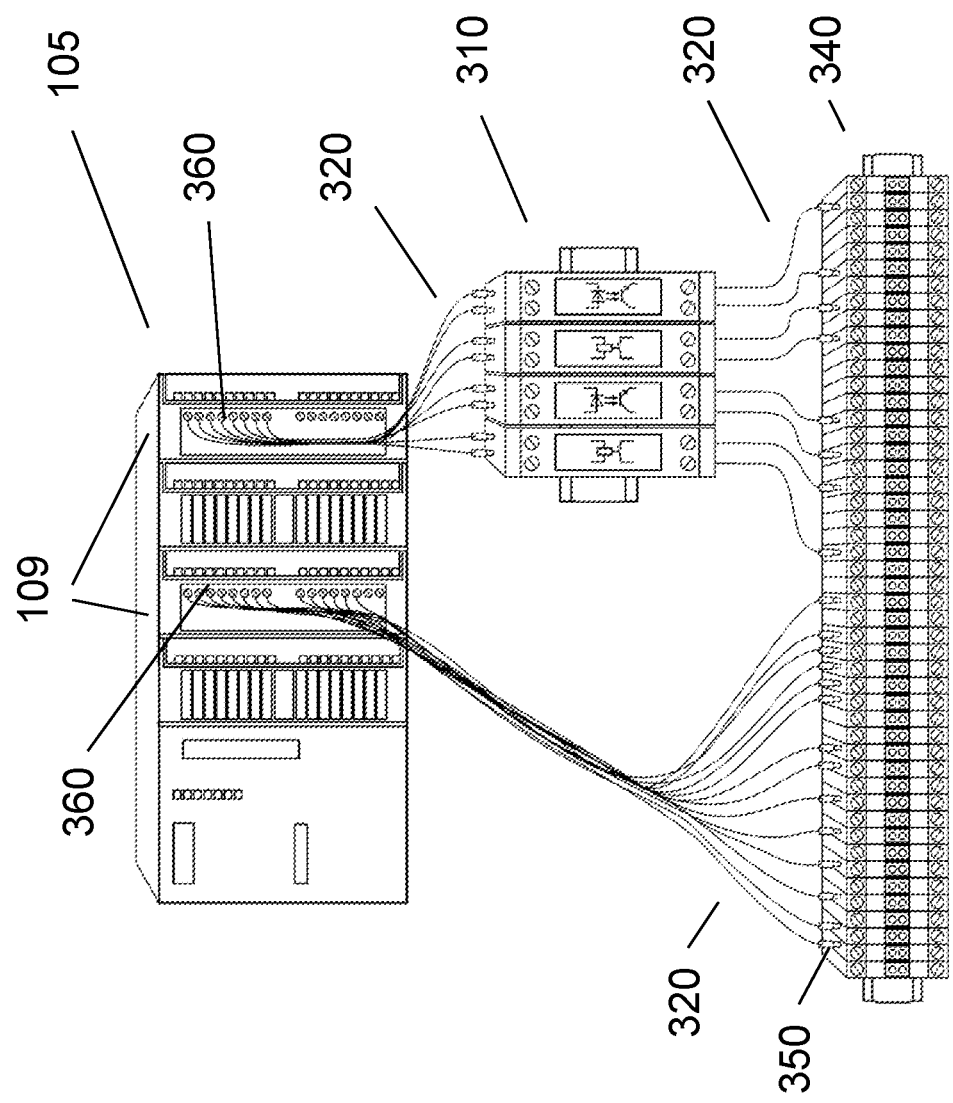
FIG. 3 schematically illustrates a conventional conventional configuration according to the prior art for transmitting I/O signals between an I/O module of an automation device for coupling an external device and this external device, with individual wires.

Finally, FIG. 3 shows an example of wiring of non-bundled individual wires 320 without any color coding, not at the end of I/O modules 109 of an automation device 105 nor at the end of external devices 310 and 340, according to the prior art. The ends of individual wires 320 connected to the external devices 310 and 340 are connected by means of screw connection terminals 350, and the ends of the individual wires 320 connected at the end of I/O modules 109 are connected by means of screw connection terminals 360, by way of example.

If, for example as shown in FIG. 3, 14 individual wires are to be directly connected between an I/O module 109 and the external device 340, once the individual wires have been connected to I/O module 109, there are 105 connection possibilities resulting for identifying the conductor wire ends at the end of external unit 340 in the order defined by I/O module 109 and for connecting them to external device 340 according to a predetermined wire assignment. If these 14 individual wires are bundled according to the present invention, for example into two cables with 7 wires each, and with a color code according to the present invention on each cable, the assignment of signal-carrying wires within a cable is already predetermined alone by this color coding, at least partially, so that in total only 56 connection options are resulting.

LIST OF REFERENCE NUMERALS

105 Automation device
107 Adapter
108 CPU
109 I/O module
110, 120, 130, 140 Connection devices
150, 160, 170, 180 Written codes
190 External devices, peripheral modules
210, 220, 230, 240 Cables
310, 340 External devices, peripheral modules
320 Individual wires
350 Screw connection terminals
360 Screw connection terminals

The invention claimed is:

1. A coding system, comprising an assembly of a plurality of individual wires,
wherein one end of each individual wire of this assembly is connected to a common adapter which is to be connected to an I/O module of an automation device for coupling an external device to a control unit of an automation system,
wherein the order of the individual wires is defined by the common adapter connectable to the I/O module,
wherein the assembly of individual wires is bundled into at least two cables emanating from the common adapter,
wherein each of the cables are color-coded by a respective hue of a single color,
the cables forming a progressive gradation of hues when the cables are arranged in a predetermined physical order,
and in addition a written code is provided, the written code comprising a byte code,
wherein the assembly of individual wires comprises at least 16 individual wires,
wherein in particular at least 8 individual wires are bundled into each respective cable emanating from the common adapter,
wherein the assembly bundled in the at least two cables is color-coded, and
wherein an other end of each individual wire appears exposed from a distal end of each cable remote from the common adapter, said other end to be individually connected to the external device.

2. A coding system, comprising an assembly of a plurality of individual wires, wherein one end of each individual wire of this assembly is connected to a common adapter which is to be connected to an I/O module of an automation device for coupling an external device to a control unit of an automation system, in particular as claimed in claim 1, wherein the order of the individual wires is defined by the common adapter connectable to the I/O module, and wherein the assembly of individual wires is bundled into at least two cables emanating from the common adapter, and wherein a respective connection device is arranged at the distal end of each cable remote from the common adapter and wherein a respective other end of each individual wire of each cable is connected to the respective connection device, and wherein said connection devices are color-coded, and wherein the connection devices are adapted to be connected to the external device.

3. The coding system as claimed in claim 2, wherein in addition to the color code, a written code is provided.

4. The coding system as claimed in claim 3, wherein the written code comprises a bit code.

5. The coding system as claimed in claim 2, wherein the color code comprises a color gradation.

6. The coding system as claimed in claim 2, wherein the color code is based on at least one of different hues, color saturations and lightnesses.

7. The coding system as claimed in claim 2, wherein the assembly of individual wires comprises at least 8 individual wires.

8. The coding system as claimed in claim 2, wherein the assembly of individual wires comprises at least 16 individual wires, wherein in particular at least 8 individual wires are bundled into each respective cable emanating from the common adapter.

9. An I/O module of an automation device, comprising a coding system as claimed in claim 2, for coupling an external device to a control unit of an automation system.

10. The coding system as claimed in claim 1, wherein the color code comprises a color gradation.

11. The coding system as claimed in claim 10, wherein the color code is based on at least one of different hues, color saturations and lightnesses.

12. The coding system as claimed in claim 1, wherein the color code is based on at least one of different hues, color saturations and lightnesses.

13. The coding system as claimed in claim 1, wherein the assembly of individual wires comprises at least 8 individual wires.

14. An I/O module of an automation device, comprising a coding system as claimed in claim 1, for coupling an external device to a control unit of an automation system.

15. The I/O module of an automation device, in particular as claimed in claim 14, comprising at least one adapter for coupling an external device to a control unit of an automation system, wherein an assembly of a plurality of individual wires is connected to said adapter with a respective end of each individual wire, wherein the order of the individual wires is defined by the common adapter, and wherein the assembly of individual wires is bundled into at least two cables emanating from the common adapter.

* * * * *